United States Patent
Holmqvist

[11] Patent Number: 6,148,050
[45] Date of Patent: Nov. 14, 2000

[54] PHASE DIGITIZER FOR RADIO COMMUNICATIONS

[75] Inventor: Peter Bo Holmqvist, Apex, N.C.

[73] Assignee: Ericsson Inc, Research Triangle Park, N.C.

[21] Appl. No.: 08/982,202

[22] Filed: Dec. 1, 1997

[51] Int. Cl.[7] .................................................. H04L 7/00
[52] U.S. Cl. ............................................. 375/355; 375/37
[58] Field of Search .................................. 375/355, 329, 375/316, 331, 226; 364/723; 324/76.82; 329/304

[56] References Cited

U.S. PATENT DOCUMENTS

| | | | |
|---|---|---|---|
| 5,084,669 | 1/1992 | Dent | 324/83 |
| 5,122,758 | 6/1992 | Tomita | 329/304 |
| 5,220,275 | 6/1993 | Homlqvist | 324/76.82 |
| 5,367,538 | 11/1994 | LaRoss et al. | 375/82 |
| 5,461,643 | 10/1995 | LaRosa et al. | 375/329 |
| 5,625,652 | 4/1997 | Petranovich | 375/355 |

FOREIGN PATENT DOCUMENTS

| | | |
|---|---|---|
| 0 446 190 A2 | 9/1991 | European Pat. Off. . |
| 0 552 601 A2 | 7/1993 | European Pat. Off. . |
| 2 277 426 | 10/1994 | United Kingdom . |
| WO 93/12603 | 6/1993 | WIPO . |

*Primary Examiner*—Chi H. Pham
*Assistant Examiner*—Emmanuel Bayard
*Attorney, Agent, or Firm*—Jenkens & Gilchrist

[57] ABSTRACT

A phase digitizer and method with error compensation is provided that utilizes recordings from a digitally generated phase reference to measure the relative time between events, such as, for example, between the input zero crossing and sample pulse events. The digital reference has a constant frequency which is equal to the desired signal frequency, and thus the phase of the reference can be used to measure the time between events. Consequently, by using the existing digitally generated phase reference, the hardware "costs" associated with implementing the prior phase digitizer error compensation approaches can be significantly reduced and/or eliminated.

27 Claims, 4 Drawing Sheets

PHASE DIGITIZER FOR RADIO COMMUNICATIONS

RELATED APPLICATION

This application is related by subject matter to U.S. Pat. No. 5,220,275 to Holmqvist, which is completely incorporated herein by reference.

BACKGROUND OF THE INVENTION

1. Technical Field of the Invention

The present invention relates in general to the communications signal processing field and, in particular, to an improved phase digitizer and method for use in the radio communications field.

2. Description of Related Art

In many electronic signal processing applications, it would be highly advantageous if the instantaneous phase of an alternating current (AC) signal were to be made directly available in a digital format. For example, it would be especially useful to have a digital representation of a signal available if it is to be numerically processed.

A significant problem encountered with existing phase-to-digital signal conversion approaches is that the phase of a signal with a fixed frequency is a continuous ramp, and to digitally represent such a ramp ultimately can entail the use of an infinite number of bits. An existing solution to this problem is to represent the phase of the signal in a circular domain such as modulo $2\pi$. For example, if an 8-bit word is chosen to represent the phase of a signal, then the circular phase angle, $0 \ldots 2\pi$, can be mapped to match the circular domain, or Galois field, of the binary word, 0.256 (modulo 256). This mapping of one circular domain onto another greatly simplifies existing numerical processing approaches.

FIG. 1 is a schematic block diagram of an existing phase digitizer circuit, which is used to convert a signal phase to a digital signal. However, before discussing any of the details shown in FIG. 1, at this point it will be useful to describe the design of a typical phase-to-digital signal conversion circuit. Assume that a reference clock signal can be generated, which is an integer multiple (e.g., binary) of an input signal frequency. The reference clock signal is input to a digital counter, which functions to divide by the integer multiple so that the divider count cycle repeats at the same rate as the expected signal input frequency. Consequently, the state of the counter can be visualized as a phase vector, which rotates precisely one revolution for each unmodulated input signal period. An output value can be produced by recording the state of the counter when the input signal passes through zero ("zero crossing"). The counter state recording can be initiated by a trigger which results from the occurrence of two events: (1) a sample pulse is generated which indicates that a measurement is desired; and (2) zero crossing of the input signal. Those values recorded for negative zero crossings are 180 degrees out of phase with those values recorded for positive zero crossings. These out of phase values can be compensated for by adding or subtracting 180 degrees from the values recorded for negative zero crossings. Adding 180 degrees to a recorded value yields the same result as subtracting 180 degrees because of the wrap-around effects of the circular phase domain.

Applying these principles to the phase digitizer circuitry 10 shown in FIG. 1, a reference clock signal is input to a digital reference generator 12, which outputs a corresponding digital reference signal. A sample of the signal desired to be digitized is input to a trigger circuit 16, which loads the value (i.e., phase) of the digital reference signal into a register 14 at the input signal zero crossing point which is nearest to the desired sample. The output of register 14 is a digital word representing the phase of the desired sample. If the value loaded by the trigger is based on a negative zero crossing, a negative zero crossing compensation circuit 18 adds (or subtracts) 180 degrees to the digital word from register 14. A second register (optional) 20 can be used to synchronize the output samples to the input pulse samples. Certain refinements have been made to the digitizer shown in FIG. 1, but the principles of operation still remain the same.

The primary drawback of the phase digitizer shown in and described with respect to FIG. 1 is that, as discussed above, the phase recordings occur at the zero crossings of the input signals. As such, for most applications, it would be preferable to generate output samples at a constant rate not so related to the input signal. The trigger circuit can be designed to accommodate this feature by triggering all phase recordings at the zero crossings nearest to the desired samples. Unfortunately, this accommodation introduces an error, which results from a difference between the point in time when the phase was sampled and the point in time that the sample was desired. Assuming that a phase sample can be recorded for both positive and negative zero crossings, this difference or error should not be greater than T/4, where T is the input signal period. However, the magnitude of the phase error caused by this time difference depends on the frequency deviation of the signal. For example, as illustrated by FIG. 2, two different input signals (e.g., one at 100 kHz, the other at 1 MHz, both with ±10 kHz maximum frequency deviation) will have a respective maximum phase error of: (1)$\phi_{error}$(100 kHz)=¼(100e$^3$−10e$^3$)$^{-1}$*10e$^3$*360=10 degrees; and (2)$\phi_{error}$(1 MHz)=¼(1e$^6$−10e$^3$)$^{-1}$*10e$^3$*360= 0.91 degrees.

For some applications, this amount of phase error is not a significant problem. However, this error becomes more significant in those applications having a relatively large signal deviation-to-signal frequency (deviation-to-frequency) ratio. Notably, as an input signal's deviation-to-frequency ratio increases, the phase digitizer's performance appreciably degrades. In order to improve the performance of applications with large deviation-to-frequency ratios, an existing error compensation approach is to record two or more phase measurements and their relationship in time relative to the desired sample. The results can then be interpolated (or extrapolated) to derive an estimated value for the sample.

For example, FIG. 3 is a diagram that illustrates such an error compensation approach. Referring to FIG. 3, an interpolated output sample, s (i.e., involving numeric operations associated with the signal phase performed as modulo $2\pi$) can be derived from the two recorded phase measurements, p1 and p2, by the expression: s=p1+(p2−p1)*t1/(t1+t2). Notably, these numeric operations are performed with a digital processor as modulo $2\pi$ relatively easily by ignoring any overflow and allowing the results to "wrap around" in that circular domain. However, the hardware "costs" (e.g., size and power consumption) associated with such an interpolation approach are relatively high, because some type of device (typically one or more binary counters) is typically utilized to measure the time between the recorded phases and the desired sample, and other hardware devices also are utilized to perform related division and multiplication functions. These hardware "costs" can be diminished slightly by using a "look up table" to replace some of the multiplication, division, and other arithmetic operations involved.

However, these "costs" still remain significantly large. As described below, the present invention successfully resolves these problems.

SUMMARY OF THE INVENTION

It is, therefore, an object of the present invention to provide an improved method for use in digitizing the phase of a received signal in a digital radiotelephone.

It is another object of the present invention to eliminate beat tones in the audio output of existing radiotelephones caused by a time difference between signal samples and recorded measurements in a phase digitizer.

It is yet another object of the present invention to provide a phase digitizer for a radiotelephone that can operate at lower intermediate frequencies than existing radiotelephones and thereby minimize the occurrence of beat tones and degraded performance.

It is still another object of the present invention to minimize hardware costs for applications using phase digitizers.

In accordance with the present invention, the foregoing and other objects are obtained by an improved phase digitizer and method with error compensation in which the phase digitizer utilizes recordings from a digitally generated phase reference to measure the relative time between events, such as, for example, between the input zero crossing and sample pulse events. The digital reference has a constant frequency which is equal to the desired signal frequency, and thus the phase of the reference can be used to measure the time between the events. Consequently, by using the existing digitally generated phase reference, the hardware "costs" associated with the prior error compensation approaches can be significantly reduced and/or eliminated.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

The preferred embodiment of the present invention and its advantages are best understood by referring to FIGS. 1–8 of the drawings, like numerals being used for like and corresponding parts of the various drawings.

Essentially, in accordance with the present invention, a phase digitizer and method with error compensation utilizes recordings from a digitally generated phase reference to measure the relative time between input events, such as, for example, between the zero crossing and sample pulse events. The digital reference has a constant frequency which is equal to the desired signal frequency, and thus the phase of the reference can be used to measure the time between events (e.g., $t=1/\omega_{ref}*\phi_{ref}$, where $\omega_{ref}$ is constant). Consequently, is by using the existing digitally generated phase reference, the hardware "costs" associated with the prior error compensation approaches can be significantly reduced and/or eliminated.

Figure 1:
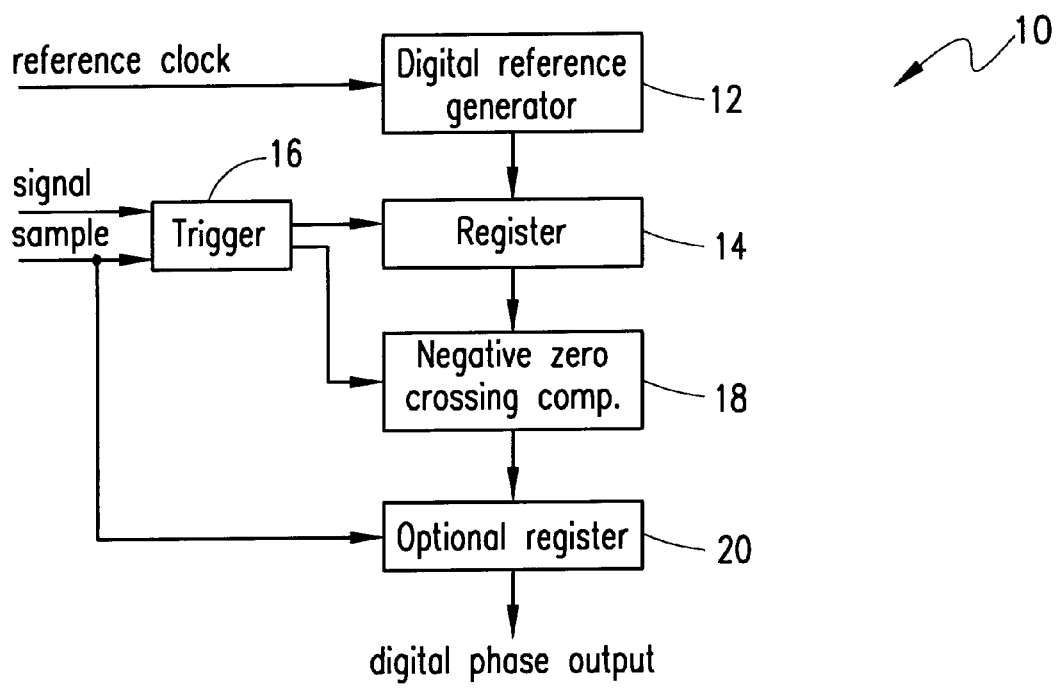
FIG. 1 is a schematic block diagram of an existing phase digitizer circuit, which is used to convert an AC signal to a digital signal.
Figure 2:
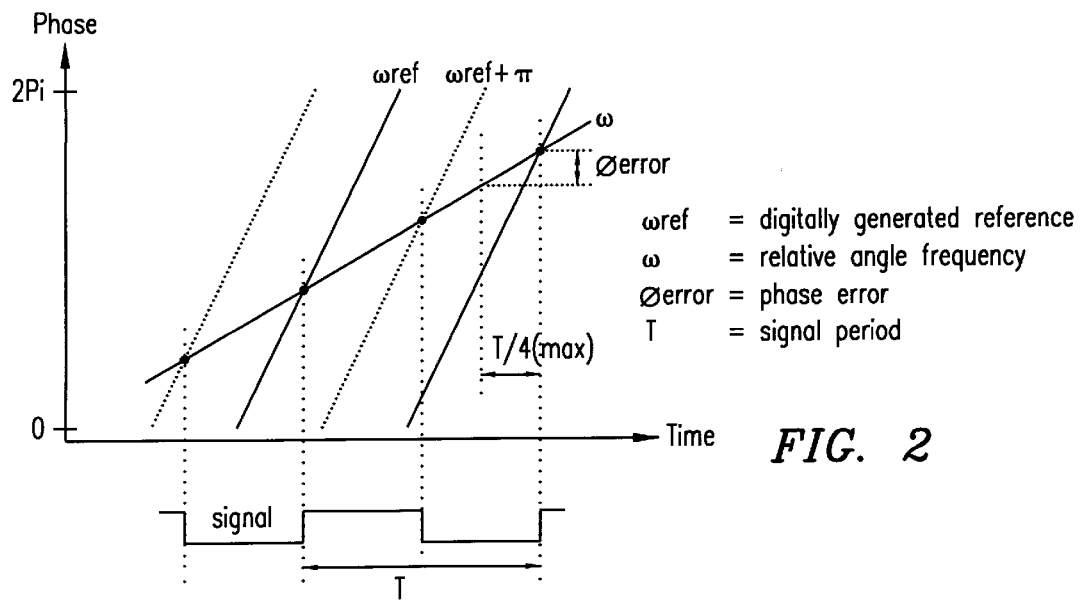
FIG. 2 is a diagram that illustrates phase error encountered with existing phase-to-digital signal conversion approaches.
Figure 3:
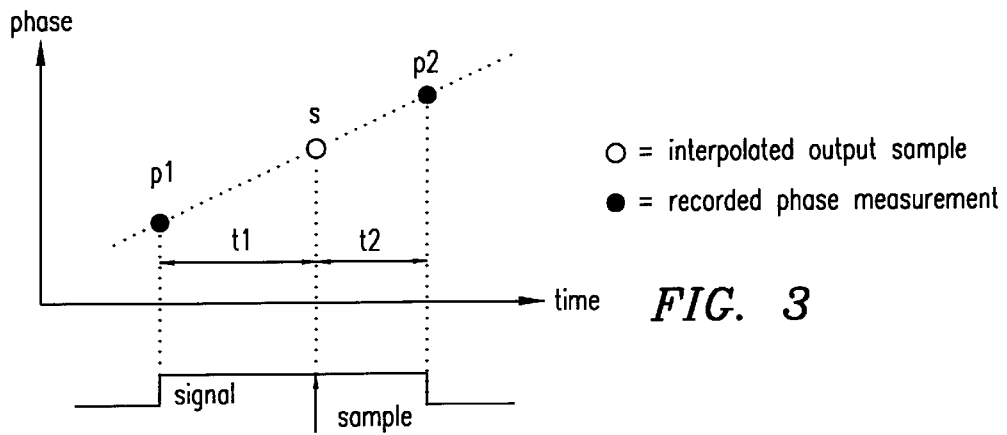
FIG. 3 is a diagram that illustrates an existing error compensation approach for applications having large deviation-to-frequency ratios.
Figure 4:
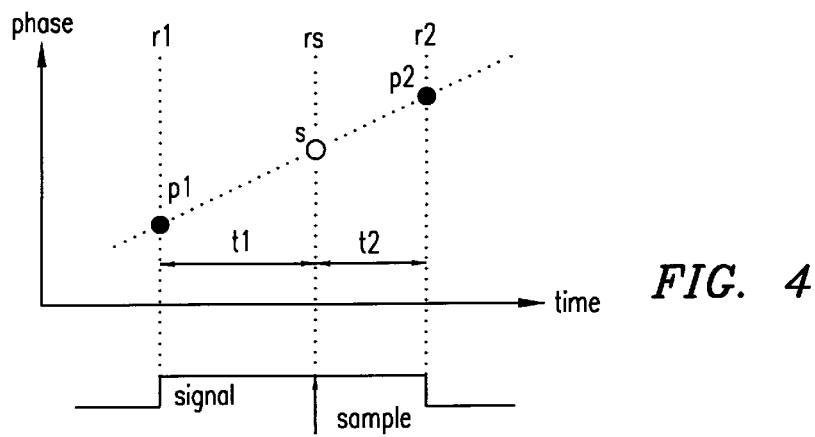
FIG. 4 is a diagram that illustrates a method for performing error compensation in a phase digitizer application, in accordance with a preferred embodiment of the present invention.

Specifically, FIG. 4 is a diagram that illustrates a method for performing error compensation in a phase digitizer application, in accordance with a preferred embodiment of the present invention. Although the phase digitizer and error compensation method described hereinafter is primarily for use in the cellular radio communications field, the invention is not intended to be so limited and can also apply to any field where a phase digitizer or similar phase/digital signal conversion circuitry is used. Referring to FIG. 4, three recorded reference counter values can be used: (1) r1 represents a recording of the first zero crossing; (2) rs represents a recording of the desired sample; and (3) r2 represents a recording of the second zero crossing. For the diagram shown in FIG. 4: p1=r1; p2=r2+180 degrees (negative zero crossing); and $t1=(rs-r1)/\omega_{ref}$. Consequently, the output sample can be expressed as: s=p1+(p2-p1)*t1/(t1+t2). Therefore, in terms of the recorded reference counter values, the output sample can be expressed as: s=r1+(r2-r1+180)*(rs-r1)/(r2-r1).

In addition to the hardware savings described above, the present invention provides another important advantage in that the time measurement provided is proportional to the expected signal frequency. Notably, this feature can yield additional reductions in the size and complexity of the circuitry utilized to perform the phase digitizer and error compensation functions. Furthermore, even greater reductions in circuit size and complexity can be realized if look up tables are also utilized.

For example, assuming that a phase digitizer can be utilized in two different applications having different input signals (e.g., one at 300 kHz, the other at 1 MHz, and both with a maximum 10 kHz frequency deviation), with the error compensation method illustrated by FIG. 4, the maximum relative time will be equal to one-half the signal period, or 1/(300 kHz–10 kHz) and 1/(1 MHz–10 kHz), respectively. The maximum relative times are approximately equal to 3.45 μs and 1.01 μs, respectively. If a look up table is used for these calculations, it can be sized appropriately, not only to yield an acceptable precision between the smaller 0 to 0.1 μs range increments, but also to be capable of accurately spanning the full range of 0 to 3.45 μs. Consequently, in accordance with the present invention and method illustrated by FIG. 4, the time measurements made are proportional to the expected signal frequency. Therefore, under the same conditions described above, the maximum relative times are, respectively: (1)½*1/(300 kHz–10 kHz)*300 kHz*360 degrees=186 degrees; and (2)½*1/(1 MHz–10 kHz)*1 MHz*360 degrees=182 degrees. In accordance with the present invention, this ratio is 1.02:1, as compared to the prior ratio of 3.4:1, which serves to significantly reduce the size of a look up table if one is utilized.

Figure 5:
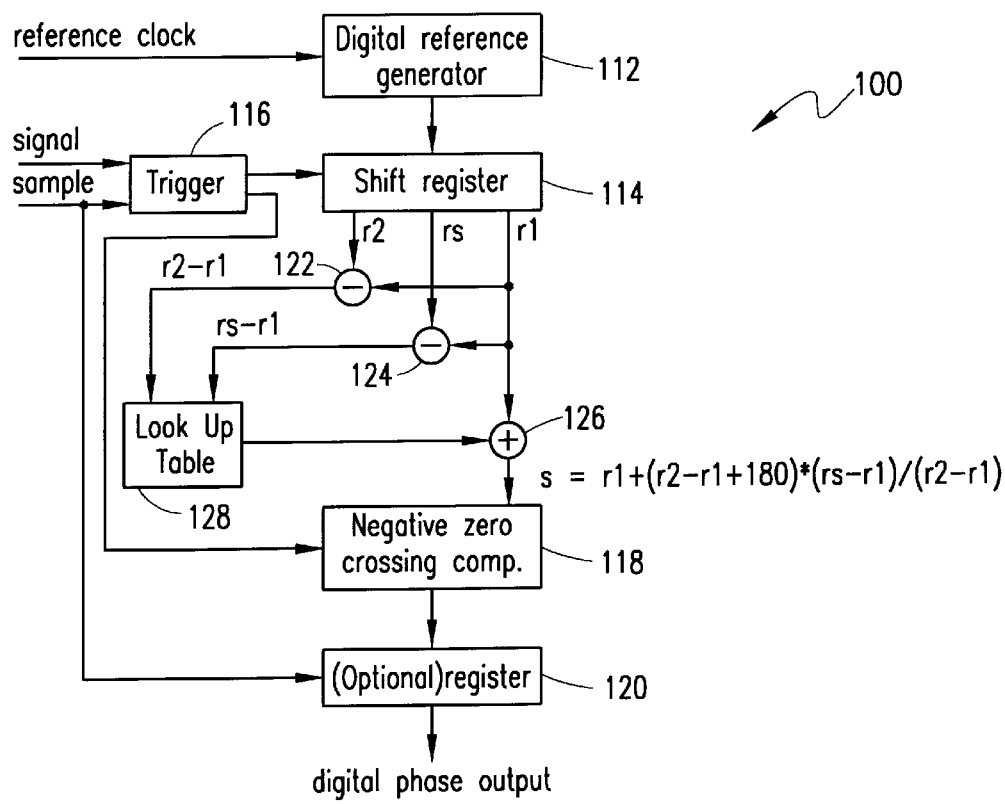
FIG. 5 is a block diagram of an exemplary phase digitizer with error compensation, which can be used to implement the method of the present invention.

FIG. 5 is a block diagram of an exemplary phase digitizer with error compensation, which can be used to implement the method of the present invention described above with respect to FIG. 4. In a preferred embodiment, the phase digitizer circuitry shown in FIG. 5 can be implemented, for example, in an Application Specific Integrated Circuit (ASIC). Referring to the error compensated phase digitizer 100 shown in FIG. 5, a trigger circuit 116 initiates a plurality of measurement recordings by using the sample pulse and input signal zero crossings to determine when to record the value of the digital reference output from digital reference generator 112. For this embodiment, three such values are recorded and shifted into the shift register 114: (1) for r1; (2) for r2 (two zero crossings nearest in time to the sample); and (3) for rs (for the sample itself). A first adder 122 can be used to algebraically subtract r1 from r2, and a second adder 124 can be used to subtract r1 from rs. The resulting values can be input to respective storage locations in a look up table 128. The look up table can be used to perform the calculations described above, such as, for example, with the inputs from the first and second adders, the output sample coupled to an input of a negative zero crossing compensator 118 is s=r1+(r2−r1+180)*(rs−r1)/(r2−r1). Depending upon whether or not the recorded value r1 is from a positive or negative zero crossing, the output phase sample may or may not be compensated (118) by 180 degrees. Preferably, for a negative zero crossing, a 180 degree compensation can be implemented by inverting the most significant bit (MSB) of the word (i.e., algebraically adding −180 degrees in two's complement form). The digital phase output from the negative zero crossing compensator 118 can be coupled (optionally) to a synchronization register 120.

Figure 6:
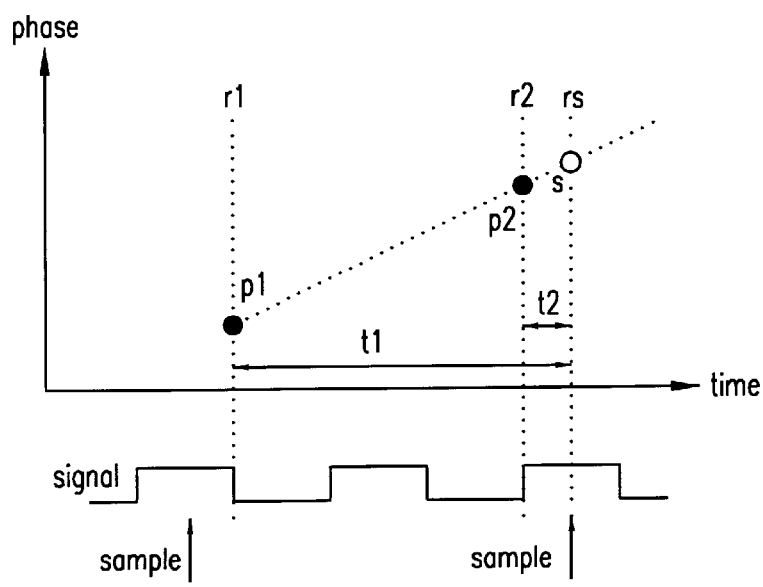
FIG. 6 is a diagram that illustrates a refinement of the present invention.

A refinement to the preferred embodiment can include an additional counter to monitor reference periods (cycles). For example, if the phase sample is represented using modulo $2\pi$, the maximum relative time that can be measured (without implementing additional time-keeping logic) is equal to one reference period. An additional counter can be used to extend this maximum relative time, by using it to keep track of the reference cycles. The counter (not explicitly shown) can increment once for each reference cycle, and its size can be selected so that the repetition rate of its count cycle is greater than the desired maximum relative time to be measured. An application for this extended time-keeping capability is to perform interpolation (e.g., as described above with respect to FIGS. 4 and 5) using measurements that are more than a reference period apart, such as, for example, if the nominal input signal frequency is higher than the sample rate. Assuming that the trigger circuit (116) reads the phase counter for the zero crossing that is nearest in time to the sample pulse, the application is similar to that illustrated by the diagram shown in FIG. 6. Notably, comparing the diagram shown in FIG. 6 with the diagram in FIG. 4, the calculations performed for the digital phase output, s, are virtually identical, except in FIG. 6, the period, t2, is negative. Consequently, a phase digitizer implementing the method illustrated in FIG. 6 is technically "extrapolating" to obtain results, as opposed to interpolating by the method illustrated in FIG. 4 (e.g., wherein t2 is positive).

Figure 7A:
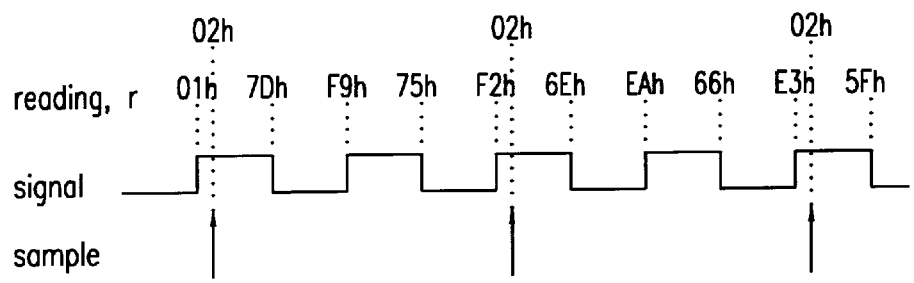
FIG. 7A is a diagram that illustrates a series of readings made in accordance with the preferred embodiment of the present invention.

The following two exemplary applications are provided as aids to better understand the present invention. As the first example, for an interpolating (or extrapolating) phase digitizer, such as the phase digitizer shown and described with respect to FIGS. 4–6, the following operating conditions may be assumed: (1) the reference clock frequency is 25.6 MHz; (2) the expected input signal frequency is 100 kHz; (3) the modulation scheme used is Direct Current (DC) with a +3 kHz offset; and (4) the sample frequency is 50 kHz. Using these reference clock and input signal frequencies, it is suitable to use an 8-bit reference counter. An 8-bit counter wraps around at modulo 256 and creates a phase vector with a frequency equal to that of the expected input signal (i.e., 25.6 MHz/256=100 kHz). Modulating the input signal causes a deviation from the 100 kHz center frequency. Assuming that frequency modulation (FM) is used, and the modulation signal is at DC, the input signal has a fixed frequency offset, such as, for example, +3 kHz, from the expected 100 kHz center frequency. The output of the phase digitizer (100) is the relative phase of the reference and input signal. Consequently, with an input signal of 103 kHz, the output of the phase digitizer is the phase of a −3 kHz signal (i.e., 100 kHz reference minus 103 kHz signal equals −3 kHz). If this negative value at the output is problematic, then a reference counter can be used that counts "down" instead of "up", or the sign can be arithmetically changed at the output (e.g., using a one or two complement for the output). The value of the reference counter can be read when a zero crossing event occurs on the input signal. FIG. 7A illustrates a series of possible readings (hexadecimal) for the above-described conditions.

Figure 7B:
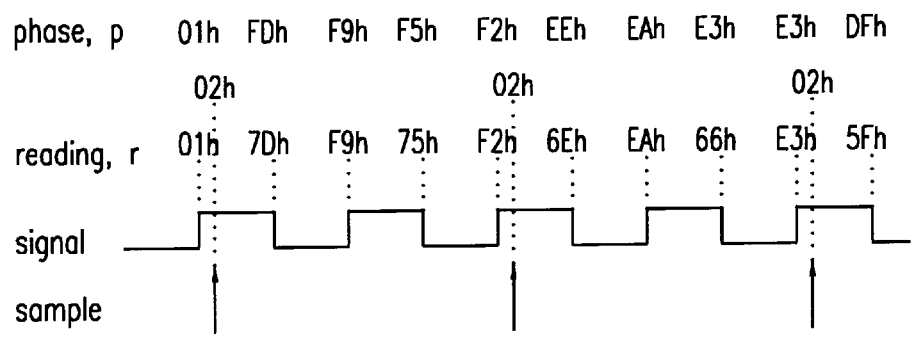
FIG. 7B is a diagram that illustrates a series of phase values resulting from 180 degree error compensation made in accordance with the preferred embodiment of the present invention.

For example, at 103 kHz, the input signal zero crossings are $1/103e^2/2$, or 4.85 $\mu s$ apart. During that period, the reference counter will decrement by 4.85 $\mu s$*25.6 MHz, or 124.27 on average. The negative zero crossing readings can be compensated by 180 degrees, since they are 180 degrees out of phase relative to the positive zero crossings. After compensating by 180 degrees, the phase values shown in FIG. 7B are available.

The next step of the method creates an output sample. Applying the interpolation method described above with respect to FIG. 4 to the reference readings and phase values illustrated in FIGS. 7A and 7B: r1=E3h; r2=5Fh; p1=E3h; p2=DFh; rs=02h; t1*$\omega_{ref}$=rs−r1=02h−E3h=1Fh; t2*$\omega_{ref}$= r2−rs=5Fh−02h=5Dh; and p2−p1=DFh−E3h=FCh. As a result, the value for the third output sample, s, is: s=p1+ (p2−p1)*t1/(t1+t2)=E3h+FCh*1Fh/(1Fh+5Dh)=E2h. Notably, as demonstrated above, the present interpolation method has little effect in this example, because of the relatively low deviation to signal frequency ratio involved.

The second example involves a relatively high deviation to signal frequency ratio. In the second example, for an interpolating (or extrapolating) phase digitizer, such as the phase digitizer shown and described with respect to FIGS. 4–6, the following operating conditions may be assumed: (1) the reference clock frequency is again 25.6 MHz; (2) the expected input signal frequency is again 100 kHz; (3) the modulation scheme used is again DC, but with a −20 kHz offset; and (4) the sample frequency is again 50 kHz. The reference counter selected for this example is 2+8=10 bits.

The operating conditions for example 2 are similar to those used for Example 1, but with two exceptions: (1) the modulation scheme used creates a −20 kHz offset; and (2) a "smarter" trigger circuit is used for example 2. In other words, the trigger circuit used for example 2 records two reference counter readings per sample. In order to get the three readings preferred for linear interpolation (or extrapolation), one reading from the previous sample is used. Notably, the interpolation method used for example 1 can take three reference counter readings per output sample. Consequently, hardware costs (particularly power consumption) can be reduced even more by recording only the two readings per output sample in example 2.

In example 2, the input signal has a frequency of 100 kHz−20 kHz=80 kHz. Consequently, referring to FIG. 8 (example 2 applied to FIG. 6), the signal has a zero crossing every $1/80e^3/2=6.25$ μs. The reference counter will increment by $6.25e^{-6}*25.6e^6=160$ between crossings. Since the readings r1 and r2 can be more than two reference counter cycles apart, the counter is preferably extended by 2 bits (e.g., 2+8 bits=10 bits) to the "left" to keep track of the extra cycles. In other words, the two additional bits ensure that r2−r1 equals $\omega_{ref}*(t1+t2)$ without losing any cycles.

Figure 8:
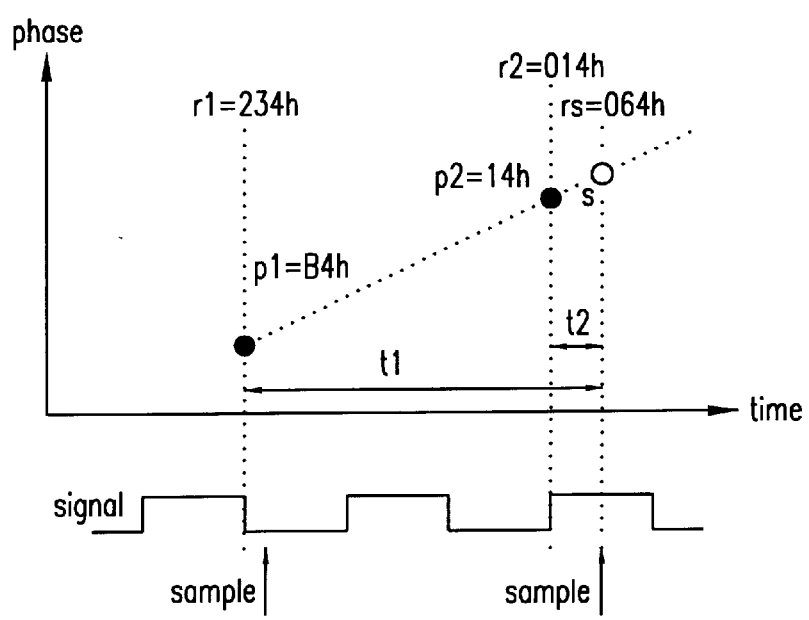
FIG. 8 is a diagram that illustrates a specific application for the refinement of the present invention illustrated by FIG. 6.

Applying the interpolation method described above with respect to FIG. 6 to the reference readings and phase values illustrated in FIG. 8: rs−r1=064h−234h=230h; r2−r1=014h−234h=1E0h; and p2−p1=14h−B4h=60h. As a result, the value for the output sample, s, is: s=p1+(p2−p1)*(rs−r1)/(r2−r1)=B4h+60h*230h/1E0h=24h. Notably, as demonstrated directly above, the present interpolation (or extrapolation) method has a significant effect in this example, because of the relatively high deviation to signal frequency ratio involved.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A method of digitizing the phase of an input signal, said method comprising the steps of:
   generating a phase reference signal having a frequency substantially equal to a desired frequency of the input signal;
   computing a value representative of the phase of the input signal at a time when a sampling signal occurs, said computing step comprising the steps of:
      recording a first value (rs) of the phase reference signal in response to the occurrence of the sampling signal, and a second (r1) and third (r2) values of the phase reference signal in response to a first and a second zero crossing of the input signal respectively, the first and second zero crossings being nearest in time to the occurrence of the sampling signal;
      computing a ratio comprising the first value relative to the values of said second and said third values of the phase reference signal; and
      computing said value representative of the phase of the input signal responsive to said ratio.

2. The method of claim 1 wherein said computing step further comprises the step of interpolating between a first and second value of the phase reference signal recorded at the two zero crossings of the input signal.

3. The method of claim 1 wherein said computing step further comprises the step of extrapolating based on a first and second value of the phase reference signal recorded at the two zero crossings of the input signal.

4. The method of claim 1 wherein said computing step further comprises the step of:
   calculating a value (s), representing the phase of the input signal at the time when the sampling signal occurred, in accordance with the formula s=r1+(r2−r1+180)*(rs−r1)/(r2−r1).

5. The method of claim 4 wherein said step of recording further comprises the step of storing rs, r1 and r2 based on the logical combination of the sampling signal and the input signal.

6. The method of claim 5 wherein said calculating step is performed using a look-up table.

7. The method of claim 5 wherein said computing step further comprises the step of adjusting the value s by 180 degrees when r1 is recorded based on a negative-going zero crossing.

8. The method of claim 7 wherein said adjusting step is performed by adding −180 degrees in two's complement form to the value s.

9. The method of claim 3 further comprising the step of counting cycles of the phase reference signal between the occurrence of sampling signals to extend timekeeping beyond one cycle of the phase reference signal.

10. An apparatus for digitizing the phase of an input signal, said apparatus comprising:
   means for generating a phase reference signal having a frequency substantially equal to a desired frequency of the input signal; and
   means for computing a value representative of the phase of the input signal at a time when a sampling signal occurs, said means for computing further comprising:
   means for recording a first value (rs) of the phase reference signal in response to the occurrence of the sampling signal, and a second (r1) and third (r2) value of the phase reference signal in response to a first and a second zero crossing of the input signal respectively, the first and second zero crossings being nearest in time to the occurrence of the sampling signal;
   means for computing a ratio comprising the first value relative to the values of said second and said third values of the phase reference signal; and
   means for computing said value representative of the phase of the input signal responsive to said ratio.

11. The apparatus of claim 10 wherein said computing is further for performing an interpolation between a first and second value of the phase reference signal recorded at the two zero crossings of the input signal.

12. The apparatus of claim 10 wherein said computing means is further for performing an extrapolation based on a first and second value of the phase reference signal recorded at the two zero crossings of the input signal.

13. The apparatus of claim 10 wherein said computing means further comprises:
   means for calculating a value (s), representing the phase of the input signal at the time when the sampling signal occurred, in accordance with the formula s=r1+(r2−r1+180)*(rs−r1)/(r2−r1).

14. The apparatus of claim 13 wherein said recording means further comprises means for triggering the storage of rs, r1 and r2 based on the logical combination of the sampling signal and the input signal.

15. The apparatus of claim 14 wherein said calculating means further comprises a look-up table.

16. The apparatus of claim 14 wherein said calculating means further comprises means for adjusting the value (s) by 180 degrees when the second value of the reference signal (r1) is based on a negative-going zero crossing.

17. The apparatus of claim 16 wherein said adjusting means adds −180 degrees in two's complement form to the value (s).

18. The apparatus of claim 12 further comprising means for counting cycles of the phase reference signal between the occurrence of sampling signals to extend timekeeping beyond one cycle of the phase reference signal.

19. An apparatus for digitizing the phase of an input signal, said apparatus comprising:

a reference generator providing as an output a phase reference signal having a frequency substantially equal to a desired frequency of the input signal; and a computational unit receiving values of the phase reference signal at a first and a second zero crossing of the input signal and at an occurrence of a sampling pulse, said computational unit providing as an output a value representing the digitized phase of the input signal at the occurrence of the sampling pulse, and wherein said computational unit further comprises a register coupled to the phase reference output of said reference generator, wherein said register stores a first value (rs) of the phase reference signal in response to the occurrence of the sampling signal, and a second (r1) and third (r2) value of the phase reference signal in response to the first and second zero crossings of the input signal, and wherein the first and second zero crossings are nearest in time to the occurrence of the sampling signal, said computational unit further computing a ratio comprising said first value relative to the values of said second and said third values of the phase reference signal, a value representative of the phase of the input signal responsive to said ratio being further computed by said computational unit.

20. The apparatus of claim 19 wherein said computational unit provides output that is an interpolation between a first and second value of the phase reference signal recorded at the two zero crossings of the input signal.

21. The apparatus of claim 19 wherein said computational unit provides an output that is an extrapolation based on a first and second value of the phase reference signal recorded at the two zero crossings of the input signal.

22. The apparatus of claim 19 wherein said computational unit further comprises:

an arithmetic unit coupled to outputs of said register to receive said first, second and third inputs, and wherein said arithmetic unit provides an output representing the phase of the input signal at the time when the sampling signal occurred, the value (s) determined in accordance with the formula $s=r1+(r2-r1+180)*(rs-r1)/(r2-r1)$.

23. The apparatus of claim 22 further comprising a trigger circuit having an output coupled to said register, said trigger circuit receiving as inputs the input signal and the sampling signal, and wherein said trigger circuit causes said register to store rs, r1 and r2 based on a logical combination of the received inputs.

24. The apparatus of claim 23 wherein said arithmetic unit further comprises a look-up table.

25. The apparatus of claim 24 wherein said arithmetic unit further comprises a negative zero crossing compensator, said compensator receiving as an input a signal indicating whether (r1) is stored in response to a negative-going zero crossing, said compensator providing an output that is the value (s) adjusted by 180 degrees when the second value of the reference signal (r1) is based on a negative-going zero crossing.

26. The apparatus of claim 25 wherein said compensator adjusts the value (s) by adding −180 degrees in two's complement form to the value (s).

27. The apparatus of claim 21 further comprising a counter having an increment input coupled to the phase reference signal and a reset input coupled to the sampling signal, whereby said counter counts the number of cycles of the phase reference signal between the occurrence of sampling signals to extend timekeeping beyond one cycle of the phase reference signal.

* * * * *

UNITED STATES PATENT AND TRADEMARK OFFICE
CERTIFICATE OF CORRECTION

PATENT NO. : 6,148,050
DATED : November 14, 2000
INVENTOR(S) : Peter Bo Holmqvist It is certified that error appears in the above-identified patent and that said Letters Patent is hereby corrected as shown below:

<u>Column 4,</u>
Line 19, replace "consequently, is by" with -- consequently, by --

Signed and Sealed this

Twenty-first Day of August, 2001

Attest:

*Attesting Officer*

NICHOLAS P. GODICI
*Acting Director of the United States Patent and Trademark Office*